United States Patent
Arakawa

(10) Patent No.: US 10,644,230 B2
(45) Date of Patent: May 5, 2020

(54) MAGNETIC MATERIAL SPUTTERING TARGET AND METHOD FOR PRODUCING SAME

(71) Applicant: JX Nippon Mining & Metals Corporation, Tokyo (JP)

(72) Inventor: Atsutoshi Arakawa, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 204 days.

(21) Appl. No.: 15/543,070

(22) PCT Filed: Feb. 24, 2016

(86) PCT No.: PCT/JP2016/055325
§ 371 (c)(1),
(2) Date: Jul. 12, 2017

(87) PCT Pub. No.: WO2016/140113
PCT Pub. Date: Sep. 9, 2016

(65) Prior Publication Data
US 2018/0019389 A1  Jan. 18, 2018

(30) Foreign Application Priority Data
Mar. 4, 2015 (JP) .................. 2015-042420

(51) Int. Cl.
*C22C 19/07* (2006.01)
*C22C 38/00* (2006.01)
*C23C 14/34* (2006.01)
*C23C 14/06* (2006.01)
*H01L 43/12* (2006.01)
*H01F 41/18* (2006.01)
*H01F 1/147* (2006.01)
*H01L 27/105* (2006.01)
*H01L 43/08* (2006.01)
*H01L 43/10* (2006.01)
*H01F 1/22* (2006.01)
*H01F 10/14* (2006.01)

(52) U.S. Cl.
CPC .............. *H01L 43/12* (2013.01); *C22C 19/07* (2013.01); *C22C 38/00* (2013.01); *C23C 14/067* (2013.01); *C23C 14/3414* (2013.01); *H01F 1/22* (2013.01); *H01F 41/183* (2013.01); *H01L 27/105* (2013.01); *H01L 43/08* (2013.01); *H01L 43/10* (2013.01); *H01F 1/147* (2013.01); *H01F 10/14* (2013.01)

(58) Field of Classification Search
CPC ................... C23C 14/3407; C23C 14/3414
See application file for complete search history.

(56) References Cited

U.S. PATENT DOCUMENTS

| 5,522,946 A * | 6/1996 | Tomita ................. H01F 10/131 148/304 |
|---|---|---|
| 7,927,434 B2 | 4/2011 | Nakamura et al. |
| 7,972,583 B2 | 7/2011 | Oda et al. |
| 8,057,650 B2 | 11/2011 | Hayashi et al. |
| 8,173,093 B2 | 5/2012 | Oda et al. |
| 8,430,978 B2 | 4/2013 | Inoue et al. |
| 9,269,389 B2 | 2/2016 | Arakawa |
| 2002/0106297 A1* | 8/2002 | Ueno ...................... C22C 19/07 419/12 |
| 2002/0189953 A1* | 12/2002 | Wang ...................... C22B 23/06 205/704 |
| 2005/0011308 A1 | 1/2005 | Ueno et al. |
| 2009/0211902 A1* | 8/2009 | Fujii ..................... C22C 1/0483 204/298.13 |
| 2011/0243784 A1 | 10/2011 | Yamamoto et al. |
| 2013/0206591 A1 | 8/2013 | Takami et al. |
| 2013/0341184 A1 | 12/2013 | Morishita et al. |
| 2015/0027882 A1 | 1/2015 | Ogino et al. |
| 2015/0107411 A1 | 4/2015 | Ogino |
| 2015/0213822 A1 | 7/2015 | Ogino |
| 2015/0262752 A1 | 9/2015 | Sawatari |
| 2016/0126072 A1 | 5/2016 | Endo |

FOREIGN PATENT DOCUMENTS

| JP | 2002-208125 A | | 7/2002 |
|---|---|---|---|
| JP | 2003-027224 A | | 1/2003 |
| JP | 2003027224 A | * | 1/2003 |
| JP | 2004-346423 A | | 12/2004 |
| JP | 2005-023349 A | | 1/2005 |
| JP | 2006-137962 A | | 6/2006 |
| JP | 2007161540 A | * | 6/2007 |
| JP | 2014-037569 A | | 2/2014 |
| JP | 2014-240515 A | | 12/2014 |
| WO | 2015/019513 A1 | | 2/2015 |

OTHER PUBLICATIONS

Translation to Aikawa (JP 2007-161540) published Jun. 2007 (Year: 2007).*
Translation to Shindo (JP 2003-027224) published Jan. 2003 (Year: 2003).*

* cited by examiner

*Primary Examiner* — John J Brayton
(74) *Attorney, Agent, or Firm* — Howson & Howson LLP

(57) ABSTRACT

A magnetic material sputtering target formed from a sintered body containing at least Co and/or Fe and B, and containing B in an amount of 10 to 50 at %, wherein an oxygen content is 100 wtppm or less. Since the magnetic material sputtering target of the present invention can suppress the generation of particles caused by oxides, the present invention yields superior effects of being able to improve the yield upon producing magnetoresistive films and the like.

19 Claims, No Drawings

MAGNETIC MATERIAL SPUTTERING TARGET AND METHOD FOR PRODUCING SAME

BACKGROUND

The present invention relates to a magnetic material sputtering target containing boron (B) which is produced via the powder sintering method, and particularly relates to a magnetic material sputtering target with minimal generation of particles during sputtering and which is useful for use in magnetic heads, magnetic resistance elements (MRAM) and the like, and to a method for producing such as a magnetic material sputtering target.

In magnetic heads and MRAMs, a tunnel magnetoresistive film having a high magnetoresistive effect is being adopted, and a magnetic body contained boron (B) is used in a material for use as the phase configuring this film. For example, known are a composition containing Co, Fe and the like and boron, Co—B, Fe—B, Co—Fe—B, or a composition obtained by adding Al, Cu, Mn, Ni or the like thereto.

In the case of Co—Fe—B, for instance, the magnetoresistive film containing B is produced by sputtering a Co—Fe—B sputtering target. This type of magnetic material target is produced via powder metallurgy or melting and casting, but in cases where a large amount of B is contained; in particular when the composition ratio of B exceeds 10 at %, a boride phase of Co or Fe with extremely brittle characteristics will be formed. Thus, when the melting method is adopted, there were problems in that the ingot would become cracked or fractured, and could not be processed into a sputtering target. While the melting method is a method that can be adopted for producing a sputtering target based on the strict management of the production process (Patent Document 1), and this method is advantageous in terms of being able to reduce oxygen and other gas components, the difficulty of the production process cannot be denied.

Meanwhile, when the sintering method is adopted, the foregoing problems that are inherent in molten products can be avoided; however, since the specific surface area of the raw material powder is great in comparison to the bulk, oxygen as a gas component is easily incorporated and the oxygen forms oxides with the metal impurities contained in the magnetic material target, and such oxides become one cause of the generation of particles during sputtering. Generally speaking, since particles deteriorate the film quality of the sputtered film and also destabilize the characteristics of magnetic heads, MRAMs and other magnetic devices, the reduction of such particles is being sought from various perspectives, and the manner of reducing particles is an extremely important issue in sputtering targets.

Note that several proposals have been made in prior patents in relation to a magnetic material target. For example, Patent Document 2 describes a Fe—Co—B-based alloy target material for depositing a soft magnetic film for use in a vertical magnetic recording medium or the like, which realizes low magnetic permeability and yields favorable sputtering characteristics. Furthermore, Patent Document 3 describes causing the atomic ratio of Fe:Co in an FeCo-based alloy to be 10:90 to 70:30, and additionally describes containing Al and/or Cr in an amount of 0.2 to 5.0 at %. Nevertheless, these Patent Documents do not focus on the impurities of the target or the particles caused by such impurities.

PRIOR ART DOCUMENT

Patent Document

Patent Document 1: International Publication No. WO2011/070860
Patent Document 2: Japanese Patent Application Publication No. 2004-346423
Patent Document 3: Japanese Patent Application Publication No. 2008-121071

SUMMARY

An object of this invention is to propose a magnetic material target capable of suppressing the generation of particles during sputtering using a magnetic sputter device and improving the yield upon producing thin films and the like by reducing the oxygen content in the magnetic material sputtering target. In particular, an object of this invention is to provide a sputtering target for forming films for use in MRAMs, magnetic heads, and other magnetic devices, as well as a method of producing such a sputtering target.

As a result of intense study to achieve the foregoing object, the present inventors devised the production process to suppress the surface oxidation of the raw material powder. As a result of discovering that a relatively large amount of Al and Si is contained in Co—B, Fe—B, and Co—Fe—B, found that it is possible to prevent these impurities from adsorbing to the raw material powder during the sintering process and reacting with oxygen to form oxides by reducing these impurities as much as possible, and thereby considerably reduce the generation of particles caused thereby. The present application provides the following invention based on the foregoing discovery.

1) A magnetic material sputtering target formed from a sintered body containing at least Co and/or Fe and B, and containing B in an amount of 10 to 50 at %, wherein a total content of Al and Si is 100 wtppm or less, and an oxygen content is 100 wtppm or less.

2) The magnetic material sputtering target according to 1) above, wherein a total content of Al, Ba, Hf, Li, Mg, Si, Sr, Ti and Zr is 100 wtppm or less.

3) A magnetic material sputtering target formed from a sintered body containing at least Co and/or Fe and B, and containing B in an amount of 10 to 50 at %, wherein a total content of Al, Ba, Hf, Li, Mg, Si, Sr, Ti and Zr is 100 wtppm or less, and an oxygen content is 100 wtppm or less.

4) A method of producing a magnetic material sputtering target, wherein a Co raw material and/or an Fe raw material and a B raw material are subject to melting and casting to prepare an alloy ingot, the alloy ingot is thereafter subject to gas atomization to prepare a raw material powder, and the raw material powder is thereafter sintered to obtain a target, and wherein the target is formed from a sintered body containing at least Co and/or Fe and B, and containing B in an amount of 10 to 50 at %, wherein a total content of Al and Si is 100 wtppm or less, and an oxygen content is 100 wtppm or less.

5) A method of producing a magnetic material sputtering target, wherein a Co raw material and/or an Fe raw material and a B raw material are subject to melting and casting to prepare an alloy ingot, the alloy ingot is thereafter subject to gas atomization to prepare a raw material powder, and the raw material powder is thereafter sintered to obtain a target, and wherein the target is formed from a sintered body containing at least Co and/or Fe and B, and containing B in an amount of 10 to 50 at %, wherein a total content of Al, Ba, Hf, Li, Mg, Si, Sr, Ti and Zr is 100 wtppm or less, and an oxygen content is 100 wtppm or less.

6) The method of producing a magnetic material sputtering target according to 4) or 5) above, wherein a final solidified part of the alloy ingot obtained via melting and casting is cut, and a remainder of the ingot is subject to gas atomization to prepare the raw material powder.

7) The method of producing a magnetic material sputtering target according to 4) to 6) above, wherein a grain size of the raw material powder is 53 to 300 µm.

The magnetic material sputtering target of the present invention has a low content of oxygen as a gas impurity in the target, and a low content of metal impurities (in particular Al and Si) which tend to form oxides. Consequently, the present invention yields superior effects of being able to suppress the generation of particles caused by oxides, improve the yield upon producing thin films and the like, and stabilize the device characteristics of magnetic heads, MRAMs and other magnetic devices.

DETAILED DESCRIPTION

The magnetic material sputtering target of the present invention is formed from a sintered body containing at least Co and/or Fe and B, and containing B in an amount of 10 to 50 at %. When the B content is less than 10 at %, it is not possible to retain the characteristics as the magnetic material target of the present invention. Furthermore, the same applies when the B content exceeds 50 at %, and, when the B content is excessive, the brittleness will increase and the strength will deteriorate, and there is an additional drawback in that it will easily crack. Accordingly, the B content is preferably 10 at % or more and 50 at % or less. Note that the addition of other elements is effective so as long as the effect of the present invention can be maintained.

What is important in the present invention is that the oxygen content in the magnetic material sputtering target is 100 wtppm or less. The amount of oxygen in the target strongly affects the generation of particles during sputtering. Oxygen as an impurity is contained as an oxide in the raw material from the beginning, and oxygen that becomes subsequently adsorbed bonds with metal impurities and forms oxides. When a non-magnetic material formed from oxides exists in the magnetic material target, abnormal discharge will occur during sputtering with such non-magnetic material as the source, and particles tend to increase.

The present invention suppresses the formation of oxides that cause the generation of particles by reducing the amount of oxygen in the raw material powder and reducing the content of metal impurities that form oxides with the oxygen as described later. While gas atomization treatment is an effective means for reducing oxygen, the mere adoption of the gas atomization method will not be able to sufficiently reduce the oxygen content. As a result of further research, the present inventors discovered that oxides already exist in the gas atomization raw material, and that the adjustment of the grain size of the gas atomization raw material is important.

Based on the foregoing discovery, the present invention is able to reduce the oxygen content to be 100 wtppm, which is an extremely low content that could not be attained conventionally, by melting the raw material prior to gas atomization treatment in order to eliminate oxides and other impurities, and by preparing a sintering raw material powder via the gas atomization method and thereafter adjusting the grain size of the raw material powder in an inert atmosphere by using such an airtight vessel as a glove box. It is thereby possible to resolve the problem unique to powder metallurgy; namely, the problem where the oxygen content tends to become high because the surface area of the raw material powder is great in comparison to the bulk.

Furthermore, the magnetic material sputtering target of the present invention is characterized in that the total content of Al and Si is 100 wtppm or less. It was discovered that a relatively large amount of Al and Si is contained as impurities in boron (B). In addition, Al and Si are stable as oxides, and it is considered that they are one cause of the generation of particles. Thus, in the target of the present invention containing B as a structural component, in addition to causing the oxygen content to be 100 ppm or less, by causing the total amount of Al and Si to be 100 ppm or less, it is possible to further reduce the generation of particles.

The oxides of Al and Si described above can be eliminated prior to performing gas atomization treatment by melting the raw material. As impurities that easily bond with oxygen and tend to get mixed into, the target of the present invention, there are Al, Ba, Hf, Li, Mg, Si, Sr, Ti, and Zr, and, by causing the total content of these impurity elements to be 100 ppm or less, it is possible to achieve the further reduction of particles. The oxides of these impurity elements can also be eliminated prior to performing gas atomization treatment by melting the raw material in the same manner as described above.

The method of producing the magnetic material sputtering target of the present invention is now explained.

Foremost, a B raw material, a Co raw material, and an Fe raw material are weighed to achieve a predetermined composition, and the raw material is thereafter melted and cast using a high-frequency induction heating-type vacuum furnace to prepare an alloy ingot. Here, the oxygen contained in the raw material reacts with B, Al, Si and the like and forms oxides when the raw material is melted in the vacuum furnace, and suspended at the upper part of the melt. By causing the oxides to surface by using a tundish during metal tapping and cutting the upper part of the ingot, which corresponds to the final solidified part of the ingot, these oxides can be eliminated. Furthermore, with regard to Ni which tends to be contained in the Co raw material, it is desirable to use a raw material that is refined in advance so that the Ni content is reduced to be roughly 30 ppm or less. Furthermore, the same applies to the B raw material, and it is desirable to use a raw material that is refined in advance so that the total content of Al, Si and other impurities is reduced to roughly 100 ppm.

The remainder of the alloy ingot is cut into a suitable size, placed in a crucible for atomization treatment, and used as the atomization raw material. Subsequently, the alloy is melted, and argon gas is subsequently injected by being sprayed on the tip of the nozzle mounted on the bottom of the crucible to prepare an atomized powder. The atomized powder is thereafter sieved in a glove box under a nitrogen atmosphere and the grain size is adjusted to be 53 to 300 µm. When the grain size is less than 53 µm, the atomized powder will adsorb oxygen during the filling process and the oxygen content will consequently increase, and this is undesirable. Furthermore, by causing the grain size of the raw material powder to be uniform, effects are yielded in that it is possible to increase the sinterability and stably produce a high density target.

The gas atomized powder is molded/sintered using a hot press device under the following conditions; namely, temperature of 750 to 1240° C., pressure of 150 to 500 kgf/cm$^2$, holding time of 1 to 3 hours, and in a vacuum atmosphere, to prepare a sintered body. The molding/sintering process is not limited to hot press, and the plasma discharge sintering method or the hot isostatic press sintering method may also be used. The foregoing sintering conditions may be arbitrarily adjusted depending on the type of material to be sintered. Subsequently, the sintered body can be subject to machining with a lathe or flat surface grinding and processed into a target of an intended size and shape.

sputtered on a 4-inch Si wafer at the time that 1 kWhr was discharged, and the number of particles that adhered to the wafer was measured using Surfscan. Consequently, it was possible to suppress the number of particles to 5. The foregoing results are shown in Table 1.

TABLE 1

|  | Composition (at %) | Production of alloy ingot Yes: O; No: X | Sieving in inert atmosphere Yes: O; No: X | Grain size of powder (μm) | Oxygen (ppm) | Al + Si (ppm) | Particle count (particles) |
|---|---|---|---|---|---|---|---|
| Example 1 | 70Fe—10Co—20B | O | O | 53-300 | 60 | 50 | 5 |
| Comparative Example 1 | 70Fe—10Co—20B | X | X | 300 or less | 180 | 120 | 15 |
| Example 2 | 80Fe—20B | O | O | 53-300 | 70 | 50 | 5 |
| Example 3 | 80Co—20B | O | O | 53-300 | 50 | 60 | 8 |
| Example 4 | 55Fe—15Co—30B | O | O | 53-300 | 60 | 64 | 8 |
| Comparative Example 2 | 55Fe—15Co—30B | X | X | 300 or less | 230 | 180 | 22 |
| Example 5 | 55Fe—15Co—30B | O | O | 100-300 | 40 | 55 | 4 |
| Comparative Example 3 | 55Fe—15Co—30B | O | X | 300 or less | 150 | 90 | 13 |
| Example 6 | 45Fe—15Co—40B | O | O | 100-300 | 80 | 90 | 9 |

EXAMPLES

The present invention is now explained in detail with reference to the Examples and Comparative Examples. Note that these Examples are merely illustrative and the present invention shall in no way be limited thereby. In other words, various modifications and other embodiments are covered by the present invention, and the present invention is limited only by the scope of its claims.

Example 1

A Co raw material, an Fe raw material, and a B raw material were weighed to achieve 70Fe-10Co-20B (at %) and melted using a high-frequency induction heating-type vacuum furnace to obtain a cast ingot having a diameter of 170 mm and a thickness of 50 mm. Excluding approximately 5 mm of the top edge of the ingot corresponding to the final solidified part during the casting process, the remainder of the ingot was cut and used as the raw material for atomization. Subsequently, the raw material was subject to gas atomization treatment to prepare a raw material powder for sintering, and the prepared powder was adjusted to have a grain size of 53 to 300 μm in an Ar flow glove box.

Subsequently, the raw material powder was sintered in a vacuum, via hot press, under the conditions of 950° C.×3 hours, 300 kgf/cm², to prepare a sintered body of 70Fe-10Co-20B. The sintered body was cut with a lathe and finished via surface grinding to obtain a disk-shaped target having a diameter of 180 mm and a thickness of 5 mm. After collecting a sample from a target mill end and performing GDMS analysis, the total content of Al and Si was 50 wtppm, and the content of Al, Ba, Hf, Li, Mg, Si, Sr, Ti, and Zr was 100 wtppm or less. As a result of performing analysis using an oxygen/nitrogen analyzer (manufactured by LECO), the oxygen content was 60 wtppm.

Sputtering was performed using the thus prepared magnetic material sputtering target. The sputtering conditions were sputter power of 1.0 kW and Ar gas pressure of 4 Pa, and a film having a target film thickness of 100 nm was

Comparative Example 1

A Co raw material, an Fe raw material, and a B raw material were weighed to achieve 70Fe-10Co-20B (at %), and, without undergoing melting and casting, the raw materials were subject to gas atomization treatment to prepare a gas atomized powder. Subsequently, the raw material powder was sieved in the atmosphere and adjusted to have a grain size of 300 μm or less, thereafter sintered in a vacuum, via hot press, under the conditions of 950° C.×3 hours, 300 kgf/cm², to prepare a sintered body of 70Fe-10Co-20B. Furthermore, the sintered body was cut with a lathe and finished via surface grinding to obtain a disk-shaped target having a diameter of 180 mm and a thickness of 5 mm.

After collecting a sample from a target mill end and performing analysis in the same manner as Example 1, the total content of Al and Si was 120 wtppm, the content of Al, Ba, Hf, Li, Mg, Si, Sr, Ti, and Zr exceeded 100 wtppm, and the oxygen content was 180 wtppm. Sputtering was performed using the thus prepared magnetic material target under the same conditions as Example 1, and the number of particles increased to 15.

Example 2

An Fe raw material and a B raw material were weighed to achieve 80Fe-20B (at %) and melted using a high-frequency induction heating-type vacuum furnace to obtain a cast ingot having a diameter of 170 mm and a thickness of 50 mm. Excluding approximately 5 mm of the top edge of the ingot corresponding to the final solidified part during the casting process, the remainder of the ingot was cut and used as the raw material for atomization. Subsequently, the raw material was subject to gas atomization treatment to prepare a raw material powder for sintering, and the prepared powder was adjusted to have a grain size of 53 to 300 μm in a glove box.

Subsequently, the raw material powder was sintered in a vacuum, via hot press, under the conditions of 950° C.×3 hours, 300 kgf/cm², to prepare a sintered body of 80Fe-20B. The sintered body was cut with a lathe and finished via surface grinding to obtain a disk-shaped target having a diameter of 180 mm and a thickness of 5 mm. After collecting a sample from a target mill end and performing analysis in the same manner as Example 1, the total content of Al and Si was 50 wtppm, the content of Al, Ba, Hf, Li, Mg, Si, Sr, Ti, and Zr was 100 wtppm or less, and the oxygen content was 70 wtppm.

Sputtering was performed using the thus prepared magnetic material sputtering target. The sputtering conditions were the same as those of Example 1. The number of particles that adhered to the wafer was measured using Surfscan. Consequently, it was possible to suppress the number of particles to 5.

Example 3

A Co raw material and a B raw material were weighed to achieve 80Co-20B (at %) and melted using a high-frequency induction heating-type vacuum furnace to obtain a cast ingot having a diameter of 170 mm and a thickness of 50 mm. Excluding approximately 5 mm of the top edge of the ingot corresponding to the final solidified part during the casting process, the remainder of the ingot was cut and used as the raw material for atomization. Subsequently, the raw material was subject to gas atomization treatment to prepare a raw material powder for sintering, and the prepared powder was adjusted to have a grain size of 53 to 300 μm in a glove box.

Subsequently, the raw material powder was sintered in a vacuum, via hot press, under the conditions of 950° C.×3 hours, 300 kgf/cm$^2$, to prepare a sintered body of 80Co-20B. The sintered body was cut with a lathe and finished via surface grinding to obtain a disk-shaped target having a diameter of 180 mm and a thickness of 5 mm. After collecting a sample from a target mill end and performing analysis in the same manner as Example 1, the total content of Al and Si was 60 wtppm, the content of Al, Ba, Hf, Li, Mg, Si, Sr, Ti, and Zr was 100 wtppm or less, and the oxygen content was 50 wtppm.

Sputtering was performed using the thus prepared magnetic material sputtering target. The sputtering conditions were the same as those of Example 1. The number of particles that adhered to the wafer was measured using Surfscan. Consequently, it was possible to suppress the number of particles to 8.

Example 4

A Co raw material, an Fe raw material, and a B raw material were weighed to achieve 55Fe-15Co-30B (at %) and melted using a high-frequency induction heating-type vacuum furnace to obtain a cast ingot having a diameter of 170 mm and a thickness of 50 mm. Excluding approximately 5 mm of the top edge of the ingot corresponding to the final solidified part during the casting process, the remainder of the ingot was cut and used as the raw material for atomization. Subsequently, the raw material was subject to gas atomization treatment to prepare a raw material powder for sintering, and the prepared powder was adjusted to have a grain size of 53 to 300 μm in a glove box.

Subsequently, the raw material powder was sintered in a vacuum, via hot press, under the conditions of 1000° C.×3 hours, 300 kgf/cm$^2$, to prepare a sintered body of 55Fe-15Co-30B. The sintered body was cut with a lathe and finished via surface grinding to obtain a disk-shaped target having a diameter of 180 mm and a thickness of 5 mm. After collecting a sample from a target mill end and performing analysis in the same manner as Example 1, the total content of Al and Si was 64 wtppm, the content of Al, Ba, Hf, Li, Mg, Si, Sr, Ti, and Zr was 100 wtppm or less, and the oxygen content was 60 wtppm.

Sputtering was performed using the thus prepared magnetic material sputtering target. The sputtering conditions were the same as those of Example 1. The number of particles that adhered to the wafer was measured using Surfscan. Consequently, it was possible to suppress the number of particles to 8.

Comparative Example 2

A Co raw material, an Fe raw material, and a B raw material were weighed to achieve 55Fe-15Co-30B (at %), and, without undergoing melting and casting, the raw materials were subject to gas atomization treatment to prepare a gas atomized powder. Subsequently, the raw material powder was sieved in the atmosphere and adjusted to have a grain size of 300 μm or less, thereafter sintered in a vacuum, via hot press, under the conditions of 1000° C.×3 hours, 300 kgf/cm$^2$, to prepare a sintered body of 55Fe-15Co-30B. Furthermore, the sintered body was cut with a lathe and finished via surface grinding to obtain a disk-shaped target having a diameter of 180 mm and a thickness of 5 mm.

After collecting a sample from a target mill end and performing analysis in the same manner as Example 1, the total content of Al and Si was 180 wtppm, the content of Al, Ba, Hf, Li, Mg, Si, Sr, Ti, and Zr exceeded 100 wtppm, and the oxygen content was 230 wtppm. Sputtering was performed using the thus prepared magnetic material target under the same conditions as Example 1, and the number of particles increased to 22.

Example 5

A Co raw material, an Fe raw material, and a B raw material were weighed to achieve 55Fe-15Co-30B (at %) and melted using a high-frequency induction heating-type vacuum furnace to obtain a cast ingot having a diameter of 170 mm and a thickness of 50 mm. Excluding approximately 5 mm of the top edge of the ingot corresponding to the final solidified part during the casting process, the remainder of the ingot was cut and used as the raw material for atomization. Subsequently, the raw material was subject to gas atomization treatment to prepare a raw material powder for sintering, and the prepared powder was adjusted to have a grain size of 100 to 300 μm in a glove box.

Subsequently, the raw material powder was sintered in a vacuum, via hot press, under the conditions of 1000° C.×3 hours, 300 kgf/cm$^2$, to prepare a sintered body of 55Fe-15Co-30B. The sintered body was cut with a lathe and finished via surface grinding to obtain a disk-shaped target having a diameter of 180 mm and a thickness of 5 mm. After collecting a sample from a target mill end and performing analysis in the same manner as Example 1, the total content of Al and Si was 55 wtppm, the content of Al, Ba, Hf, Li, Mg, Si, Sr, Ti, and Zr was 100 wtppm or less, and the oxygen content was 40 wtppm.

Sputtering was performed using the thus prepared magnetic material sputtering target. The sputtering conditions were the same as those of Example 1. The number of particles that adhered to the wafer was measured using Surfscan. Consequently, it was possible to suppress the number of particles to 4.

Comparative Example 3

A Co raw material, an Fe raw material, and a B raw material were weighed to achieve 55Fe-15Co-30B (at %) and melted using a high-frequency induction heating-type vacuum furnace to obtain a cast ingot having a diameter of 170 mm and a thickness of 50 mm. Excluding approximately 5 mm of the top edge of the ingot corresponding to the final solidified part during the casting process, the remainder of the ingot was cut and used as the raw material for atomization. Subsequently, the raw material was subject to gas atomization treatment to prepare a raw material powder for sintering, and the prepared powder was adjusted to have a grain size of grain size 300 μm or less in the atmosphere.

Subsequently, the raw material powder was sintered in a vacuum, via hot press, under the conditions of 1000° C.×3 hours, 300 kgf/cm², to prepare a sintered body of 55Fe-15Co-30B. The sintered body was cut with a lathe and finished via surface grinding to obtain a disk-shaped target having a diameter of 180 mm and a thickness of 5 mm. After collecting a sample from a target mill end and performing analysis in the same manner as Example 1, the total content of Al and Si was 90 wtppm, the content of Al, Ba, Hf, Li, Mg, Si, Sr, Ti, and Zr was 100 wtppm or less, and the oxygen content was 150 wtppm.

Sputtering was performed using the thus prepared magnetic material sputtering target. The sputtering conditions were the same as those of Example 1. The number of particles that adhered to the wafer was measured using Surfscan. Consequently, the number of particles increased to 13.

Example 6

A Co raw material, an Fe raw material, and a B raw material were weighed to achieve 45Fe-15Co-40B (at %) and melted using a high-frequency induction heating-type vacuum furnace to obtain a cast ingot having a diameter of 170 mm and a thickness of 50 mm. Excluding approximately 5 mm of the top edge of the ingot corresponding to the final solidified part during the casting process, the remainder of the ingot was cut and used as the raw material for atomization. Subsequently, the raw material was subject to gas atomization treatment to prepare a raw material powder for sintering, and the prepared powder was adjusted to have a grain size of 100 to 300 μm in a glove box.

Subsequently, the raw material powder was sintered in a vacuum, via hot press, under the conditions of 1100° C.×3 hours, 300 kgf/cm², to prepare a sintered body of 45Fe-15Co-40B. The sintered body was cut with a lathe and finished via surface grinding to obtain a disk-shaped target having a diameter of 180 mm and a thickness of 5 mm. After collecting a sample from a target mill end and performing analysis in the same manner as Example 1, the total content of Al and Si was 90 wtppm, the content of Al, Ba, Hf, Li, Mg, Si, Sr, Ti, and Zr was 100 wtppm or less, and the oxygen content was 80 wtppm.

Sputtering was performed using the thus prepared magnetic material sputtering target. The sputtering conditions were the same as those of Example 1. The number of particles that adhered to the wafer was measured using Surfscan. Consequently, it was possible to suppress the number of particles to 9.

The magnetic material sputtering target of the present invention can suppress the generation of particles caused by oxides because the oxygen content in the target is low and the content of Al and Si, which tend to form oxides, is also low, and yields superior effects of being able to improve the yield upon producing thin films and the like. The present invention is useful as a sputtering target for forming a magnetic thin film for use in magnetic heads, MRAMs and other magnetic devices.

The invention claimed is:

1. A magnetic material sputtering target formed from a sintered body containing Co and B, Fe and B, or Co, Fe and B, such that the sintered body contains 10 to 50 at % of B, and wherein a total content of Al and Si is of 100 wtppm or less, and an oxygen content is of 100 wtppm or less.

2. A magnetic material sputtering target formed from a sintered body containing Co and B, Fe and B, or Co, Fe and B, such that the sintered body contains 10 to 50 at % of B, wherein a total content of Al, Ba, Hf, Li, Mg, Si, Sr, Ti and Zr is 100 wtppm or less, and an oxygen content is 100 wtppm or less.

3. The magnetic material sputtering target according to claim 1, wherein a total content of Al, Ba, Hf, Li, Mg, Si, Sr, Ti and Zr is 100 wtppm or less.

4. A method of producing a magnetic material sputtering target, wherein a Co raw material and a B raw material, an Fe raw material and a B raw material, or Co, Fe and B raw materials are subject to melting and casting to prepare an alloy ingot, the alloy ingot is thereafter subject to gas atomization to prepare a raw material powder, and the raw material powder is thereafter sintered to obtain a target formed from a sintered body, and wherein the sintered body contains Co and B, Fe and B, or Co, Fe and B, such that the sintered body contains 10 to 50 at % of B, wherein a total content of Al and Si is 100 wtppm or less, and an oxygen content is 100 wtppm or less.

5. The method of producing a magnetic material sputtering target according to claim 4, wherein a final solidified part of the alloy ingot obtained via melting and casting is cut, and a remainder of the ingot is subject to gas atomization to prepare the raw material powder.

6. The method of producing a magnetic material sputtering target according to claim 5, wherein a grain size of the raw material powder is 53 to 300 μm.

7. The method of producing a magnetic material sputtering target according to claim 4, wherein a grain size of the raw material powder is 53 to 300 μm.

8. A method of producing a magnetic material sputtering target, wherein a Co raw material and a B raw material, an Fe raw material and a B raw material, or Co, Fe and B raw materials are subject to melting and casting to prepare an alloy ingot, the alloy ingot is thereafter subject to gas atomization to prepare a raw material powder, and the raw material powder is thereafter sintered to obtain a target formed from a sintered body, and wherein the sintered body contains Co and B, Fe and B, or Co, Fe and B, such that the sintered body contains 10 to 50 at % of B, wherein a total content of Al, Ba, Hf, Li, Mg, Si, Sr, Ti and Zr is 100 wtppm or less, and an oxygen content is 100 wtppm or less.

9. The method of producing a magnetic material sputtering target according to claim 8, wherein a final solidified part of the alloy ingot obtained via melting and casting is cut, and a remainder of the ingot is subject to gas atomization to prepare the raw material powder.

10. The method of producing a magnetic material sputtering target according to claim 9, wherein a grain size of the raw material powder is 53 to 300 μm.

11. The method of producing a magnetic material sputtering target according to claim 8, wherein a grain size of the raw material powder is 53 to 300 μm.

12. The method of producing a magnetic material sputtering target according to claim 8, wherein the sintered body consists essentially of Co and B, Fe and B, or Co, Fe and B.

13. The method of producing a magnetic material sputtering target according to claim 12, wherein the sintered body contains 30 to 40 at % of B.

14. The method of producing a magnetic material sputtering target according to claim 4, wherein the sintered body consists essentially of Co and B, Fe and B, or Co, Fe and B.

15. The method of producing a magnetic material sputtering target according to claim 14, wherein the sintered body contains 30 to 40 at % of B.

16. The magnetic material sputtering target according to claim 2, wherein the sintered body consists essentially of Co and B, Fe and B, or Co, Fe and B.

17. The magnetic material sputtering target according to claim 16, wherein the sintered body contains 30 to 40 at % of B.

18. The magnetic material sputtering target according to claim 1, wherein the sintered body consists essentially of Co and B, Fe and B, or Co, Fe and B.

19. The magnetic material sputtering target according to claim 18, wherein the sintered body contains 30 to 40 at % of B.

* * * * *